US006897139B2

(12) United States Patent
Shibata et al.

(10) Patent No.: US 6,897,139 B2
(45) Date of Patent: May 24, 2005

(54) GROUP III NITRIDE COMPOUND SEMICONDUCTOR DEVICE

(75) Inventors: Naoki Shibata, Aichi (JP); Masanobu Senda, Aichi (JP)

(73) Assignee: Toyoda Gosei Co., Ltd., Aichi (JP)

(*) Notice: Subject to any disclaimer, the term of this patent is extended or adjusted under 35 U.S.C. 154(b) by 0 days.

(21) Appl. No.: 10/297,840

(22) PCT Filed: Jul. 18, 2001

(86) PCT No.: PCT/JP01/06238

§ 371 (c)(1),
(2), (4) Date: Dec. 11, 2002

(87) PCT Pub. No.: WO02/07233

PCT Pub. Date: Jan. 24, 2002

(65) Prior Publication Data

US 2003/0134447 A1 Jul. 17, 2003

(30) Foreign Application Priority Data

Jul. 19, 2000 (JP) ........................... 2000-219798

(51) Int. Cl.[7] ............... H01L 21/28; H01L 21/3205
(52) U.S. Cl. .............. 438/606; 438/20; 438/22; 438/40; 438/43; 438/46; 438/478; 257/10; 257/13; 257/79; 257/292; 257/293; 257/918
(58) Field of Search .................. 438/606, 20–49, 438/149, 478; 257/9–15, 21, 86, 184, 290–295, 79–98, 918

(56) References Cited

U.S. PATENT DOCUMENTS

| 5,115,286 | A | * | 5/1992 | Camras et al. ............ 257/94 |
| 5,223,374 | A | * | 6/1993 | Mohr et al. ............. 430/257 |
| 5,545,291 | A | * | 8/1996 | Smith et al. ............. 438/107 |
| 6,045,626 | A | * | 4/2000 | Yano et al. ............. 148/33.4 |
| 6,086,673 | A | * | 7/2000 | Molnar ................... 117/90 |

(Continued)

FOREIGN PATENT DOCUMENTS

| EP | 1 039 555 A1 | | 3/2000 | |
| EP | 1361616 A1 | * | 11/2003 | |
| JP | 56-042390 | * | 9/1979 | .......... H01L/33/00 |
| JP | 9-51139 | | 2/1997 | |
| JP | 9-227298 | | 9/1997 | |
| JP | 9-237938 | | 9/1997 | |
| JP | 10-97994 | | 4/1998 | |
| JP | 10-256603 | | 9/1998 | |
| JP | 10-321954 | | 12/1998 | |
| JP | 11-176758 | | 7/1999 | |
| JP | 11-195814 | | 7/1999 | |
| JP | 2000-114597 | | 4/2000 | |
| JP | 2003043308 | * | 2/2002 | ......... H01L/21/205 |
| WO | WO 96/26006 | * | 8/1996 | ............ B01J/37/34 |

OTHER PUBLICATIONS

Panda et al. "Low temperature chemical vapor deposition of titanium nitride films from tetrakis–titanium and ammonia" Thin solid films vol. 357 1999 p. 125–131.*

Rouleau et al., "Pulsed KrF laser deposited GaN/TiN/Si(111) heterostructures by sequential TiN and liquid Ga laser ablation", Appl. Phys. A 69 [Suppl.], S441–S445 (1999).

International Preliminary Examination Report dated Mar. 4, 2002.

International Search Report dated Feb. 5, 2002.

*Primary Examiner*—Matthew Smith
*Assistant Examiner*—Granvill D. Lee, Jr.
(74) *Attorney, Agent, or Firm*—McGinn & Gibb, PLLC

(57) ABSTRACT

A titanium layer and a titanium nitride layer are successively laminated on a substrate and a group III nitride compound semiconductor layer is further formed thereon. When the titanium layer is removed in the condition that a sufficient film thickness is given to the titanium nitride layer, a device having the titanium nitride layer as a substrate is obtained.

20 Claims, 4 Drawing Sheets

U.S. PATENT DOCUMENTS

| | | | |
|---|---|---|---|
| 6,100,545 A | | 8/2000 | Chiyo et al. |
| 6,100,586 A | * | 8/2000 | Chen et al. ................. 257/745 |
| 6,176,925 B1 | * | 1/2001 | Solomon et al. ............... 117/89 |
| 6,265,653 B1 | * | 7/2001 | Haigh et al. ................. 136/249 |
| 6,281,526 B1 | * | 8/2001 | Nitta et al. ................. 257/103 |
| 6,342,404 B1 | * | 1/2002 | Shibata et al. ................. 438/46 |
| 6,355,393 B1 | * | 3/2002 | Hirai et al. ................. 430/139 |
| 6,399,873 B1 | * | 6/2002 | Sano et al. ................. 136/249 |
| 6,423,990 B1 | * | 7/2002 | El-Sharawy et al. ........ 257/197 |
| 6,426,512 B1 | * | 7/2002 | Ito et al. ....................... 257/12 |
| 6,531,719 B2 | * | 3/2003 | Shibata et al. .............. 257/190 |
| 6,590,229 B1 | * | 7/2003 | Yamazaki et al. ............ 257/71 |
| 6,593,016 B1 | * | 7/2003 | Chiyo et al. ................ 428/698 |
| 6,623,998 B2 | * | 9/2003 | Shibata et al. ................ 438/22 |
| 2001/0038103 A1 | * | 11/2001 | Nitta et al. ................. 257/103 |
| 2002/0036055 A1 | * | 3/2002 | Yoshimura et al. ......... 156/234 |
| 2003/0134488 A1 | * | 7/2003 | Yamazaki et al. .......... 438/455 |

\* cited by examiner

FIG. 4A
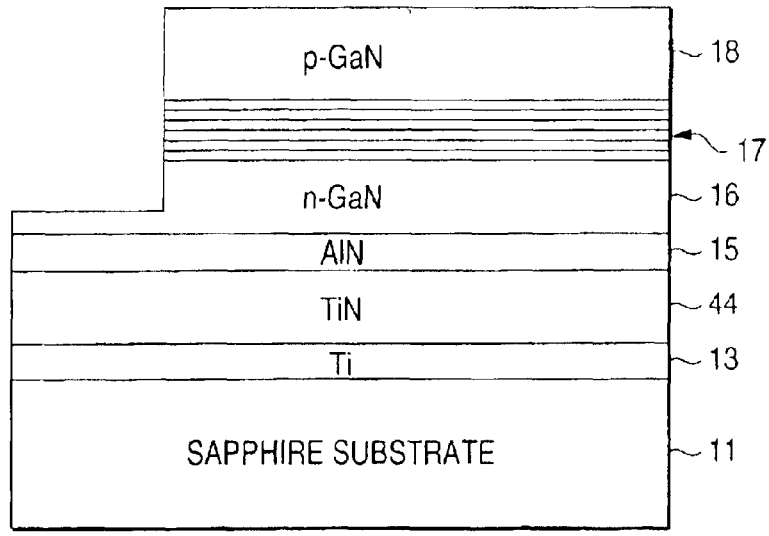
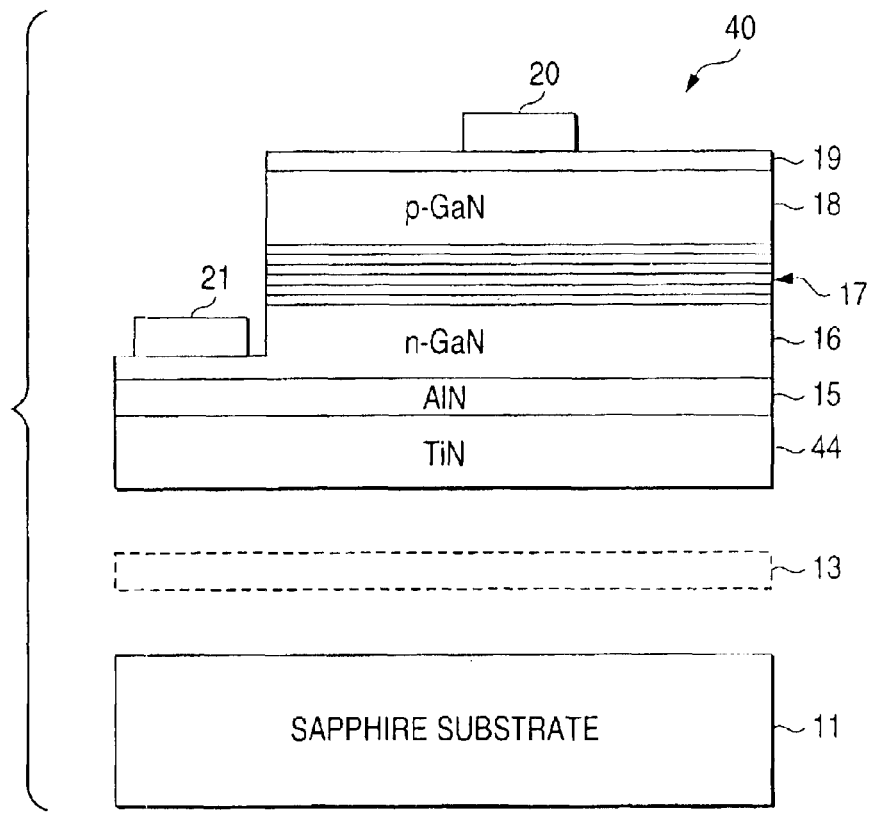
FIG. 4B

GROUP III NITRIDE COMPOUND SEMICONDUCTOR DEVICE

TECHNICAL FIELD

The present invention relates to a group III nitride compound semiconductor device.

BACKGROUND ART

Unexamined Japanese Patent Publication No. Hei. 9-237938 has disclosed that a (111) surface of metal nitride having a rock salt structure as an undercoat layer is used as a substrate in order to obtain group III nitride compound semiconductor layers with good crystallinity. That is, in this publication 9-237938, metal nitride having a rock salt structure is used as a substrate so that group III nitride compound semiconductor layers are grown on the (111) surface of the substrate.

A substrate for semiconductor device needs to have characteristic (stiffness, impact resistance, and so on) for retaining the function of the device. When the substrate is made of metal nitride, it is conceived that the substrate needs to have a thickness of not smaller than 50 µm to retain the characteristic.

Metal nitride with such a large thickness has been never provided as a raw material for semiconductor-producing industrial products.

Therefore, an object of the present invention is to form group III nitride compound semiconductor layers with a good crystal structure by use of raw materials industrially easily available. Accordingly, the semiconductor device produced by the present invention has semiconductor layers with a good crystal structure and can be produced inexpensively.

According to a different aspect, another object of the present invention is to provide a group III nitride compound semiconductor device having a novel structure, and a method of producing the device.

DISCLOSURE OF INVENTION

The inventors of the present invention have made eager examinations in order to achieve at least one of the foregoing objects. As a result, the following invention has been conceived.

That is, according to the present invention, there is provided a group III nitride compound semiconductor device comprising: a titanium layer formed on a substrate; a metal nitride layer formed on the titanium layer and made of nitride of one kind of metal or of two or more kinds of metals selected from the group consisting of titanium, zirconium, hafnium and tantalum; and a group III nitride compound semiconductor layer formed on the metal nitride layer.

In the semiconductor device configured as described above according to the present invention, a layer made of nitride of one kind of metal or two or more kinds of metals selected from the group consisting of titanium, hafnium, zirconium and tantalum is formed on a substrate through a titanium layer. The metal nitride layer is very low in lattice mismatching between the metal nitride layer and a group III nitride compound semiconductor layer formed on the metal nitride layer. Moreover, the metal nitride layer can be formed with good crystallinity on the titanium layer. Moreover, the titanium layer can be formed with good crystallinity on a substrate of sapphire or the like. On the other hand, the thickness required for retaining the function of the device can be given by the substrate, so that the metal nitride layer can be made thin. Accordingly, the metal nitride layer can be formed easily and inexpensively. When a general material such as sapphire or the like is used as the substrate, the device can be produced inexpensively as a whole.

BRIEF DESCRIPTION OF DRAWINGS

FIGS. 4A and 4B show a light-emitting diode according to a fourth embodiment of the present invention.

Figure 1:
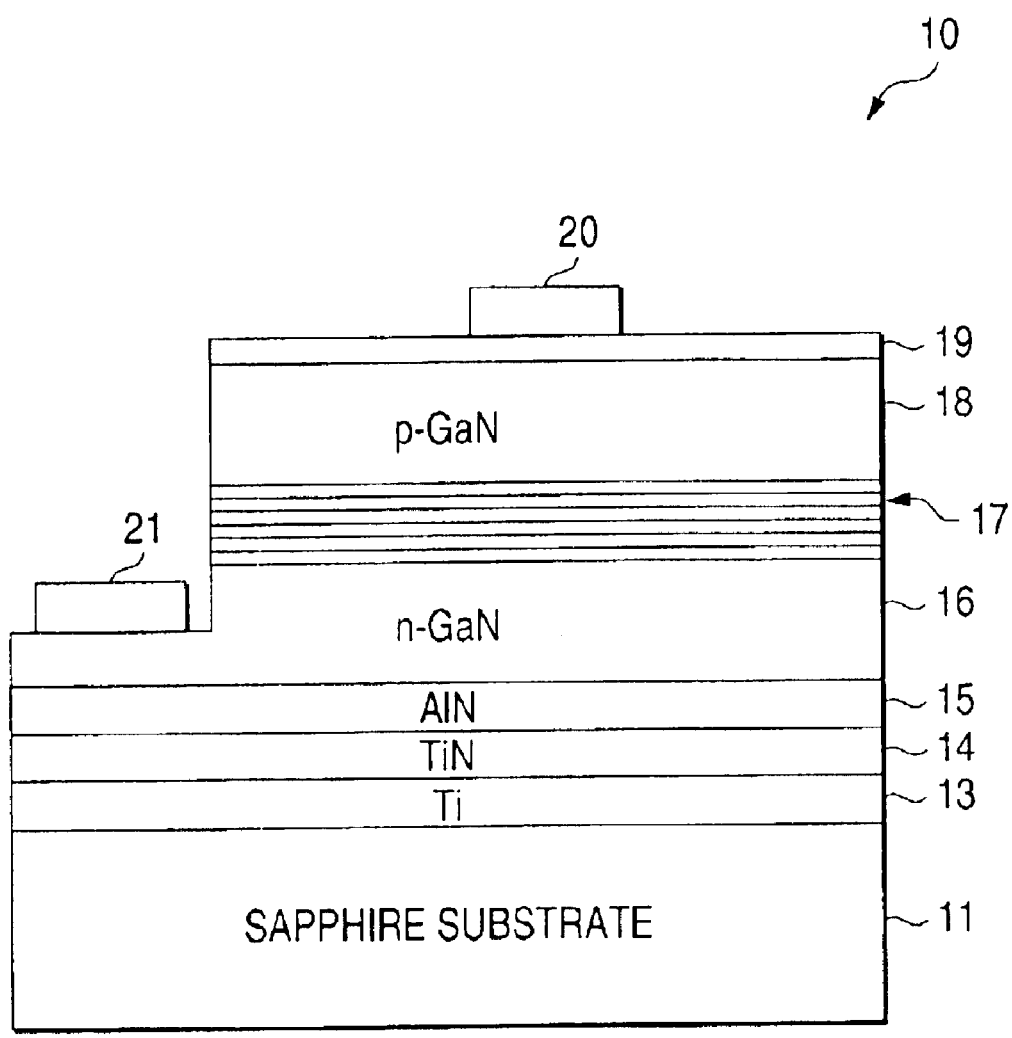
FIG. 1 is a view showing the configuration of a light-emitting diode according to a first embodiment of the present invention.

In the drawings, each of the reference numerals 10, 22, 32 and 40 designates a light-emitting diode; each of 11 and 25, a substrate; 13, a Ti layer; 14, a TiN layer; 15, a buffer layer; each of 16 and 26, a clad layer; 17, a layer containing a light-emitting layer; each of 18 and 28, a clad layer; and 19, a light-transmissible electrode.

BEST MODE FOR CARRYING OUT THE INVENTION

In the present invention, a hexagonal material such as sapphire, SiC (silicon carbide), GaN (gallium nitride), etc. or a cubic material such as Si (silicon), GaP (gallium phosphide), GaAs (gallium arsenide), etc. can be used as a substrate. In the case of a hexagonal material, an undercoat layer is grown on the substrate. In the case of a cubic material, a (111) surface of the substrate is used.

When SiC, GaN, silicon, GaP or GaAs is used as the substrate, electrically conductive characteristic can be given to the substrate. As will be described later, metal nitride such as titanium nitride (TiN), hafnium nitride, zirconium nitride and tantalum nitride has electrically conductive characteristic. As a result, electrodes can be formed on opposite surfaces of a semiconductor device. Hence, the number of steps for producing the device is reduced, so that the cost of production thereof is reduced.

When an LED is produced by use of sapphire as a substrate, luminance is expected to increase because metal nitride has metallic gloss that light emitted from the LED is reflected by titanium nitride, hafnium nitride, zirconium nitride, tantalum nitride, or the like.

There is also an operation of relaxing distortion (internal stress) caused by the difference in lattice constant or thermal expansion coefficient between the sapphire substrate and each group III nitride compound semiconductor layer because metal nitride has lower stiffness than sapphire.

The substrate needs to have characteristic (stiffness and impact resistance) for retaining the function of the device. It is therefore preferable that the thickness of the substrate is selected to be not smaller than 50 µm. It is more especially preferable that the thickness is 100 µm. Incidentally, the thickness may be smaller if the stiffness can be kept sufficiently.

As the metal nitride, nitride of a metal selected from the group consisting of titanium, hafnium, zirconium and tantalum or nitride of an alloy of these metals is used.

The method for growing the metal nitride is not particularly limited but examples of the available method include:

CVD (Chemical Vapor Deposition) such as plasma CVD, thermal CVD, optical CVD, or the like; PVD (Physical Vapor Deposition) such as sputtering, reactive sputtering, laser ablation, ion plating, evaporation, ECR, or the like; and so on.

It is especially preferable that a sputtering method is used when one of these metal nitride layers is formed on the titanium layer. This is because the crystallinity of the metal nitride single crystal is improved.

The thickness of the metal nitride layer is preferably selected to be in a range of from 5 nm to 10 $\mu$m when the substrate and the titanium layer are provided.

When the metal nitride layer is separated from the substrate by removing the titanium layer, the metal nitride layer preferably has a film thickness of not smaller than 50 $\mu$m because the metal nitride layer needs to have characteristic of a substrate. The film thickness of the metal nitride layer is more preferably selected to be not-smaller than 100 $\mu$m.

The titanium layer is interposed between the metal nitride layer and the substrate. The titanium layer is formed on the substrate by a vapor deposition method or by a sputtering method. The film thickness of the titanium layer is not particularly limited but is selected to be preferably in a range of from 0.1 to 10 $\mu$m, more especially preferably in a range of from 0.1 to 5 $\mu$m, most especially preferably in a range of from 0.2 to 3 $\mu$m.

According to the inventors' examination, it is preferable that an Al layer is interposed between a (111) surface of silicon and the titanium layer when the titanium layer is grown on the (111) surface of silicon used as a substrate. The thickness of the Al layer is not particularly limited but is selected to be about 100 Å. The method of forming the Al layer is not particularly limited but, for example, the Al layer is formed by vapor deposition or by sputtering.

The titanium layer can be chemically etched with acid (such as aqua regia). As a result, the substrate is separated from the metal nitride layer. According to the metal nitride layer having electrically conductive characteristic, the metal nitride layer can be used as an electrode. Hence, it will do to form only one electrode on the group III nitride compound semiconductor layer side.

Each group III nitride compound semiconductor is represented by the general formula: $Al_XGa_YIn_{1-X-Y}N$ ($0\leq X \leq 1$, $0\leq Y \leq 1$, $0\leq X+Y \leq 1$) which includes so-called binary compounds such as AlN, GaN and InN, and so-called ternary compounds such as $Al_XGa_{1-X}N$, $Al_XIn_{1-X}N$ and $Ga_XIn_{1-X}N$ (here, $0<x<1$). The group III elements may be partially replaced by boron (B), thallium (Tl), or the like. The nitrogen (N) may be partially replaced by phosphorus (P), arsenic (As), antimony (Sb), bismuth (Bi), or the like. The group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, the group III nitride compound semiconductor doped with p-type impurities may be irradiated with electron beams or with plasma or heated in a furnace. The method of forming each group III nitride compound semiconductor layer is not particularly limited. For example, the group III nitride compound semiconductor layer may be formed by a metal organic chemical vapor deposition method (MOCVD method) or may be formed by a well known method such as a molecular beam epitaxy method (MBE method), a halide vapor phase epitaxy method (HVPE method), a sputtering method, an ion-plating method, an electron showering method, etc.

Incidentally, a homo structure, a single hetero structure or a double hetero structure may be used as the structure of the light-emitting device. A quantum well structure (single quantum well structure or multiple quantum well structure) may be also used as the structure of the layers including the light-emitting layer.

A buffer layer may be formed between the metal nitride layer and a set of group III nitride compound semiconductor layers (second group III nitride compound semiconductor) constituting the device function portion. The buffer layer is made of a first group III nitride compound semiconductor. Here, examples of the first group III nitride compound semiconductor include quarternary compound semiconductors represented by $Al_XGa_YIn_{1-X-Y}N$ ($0<X<1$, $0<Y<1$, $0<X+Y<1$), ternary compound semiconductors represented by $Al_XGa_{1-X}N$ ($0<X<1$), and AlN, GaN and InN.

In the MOCVD method, the first group III nitride compound semiconductor layer (buffer layer) of AlN, GaN or the like was directly formed on a substrate of sapphire or the like at a low temperature of about 400° C. As for the metal nitride layer, however, the first group III nitride compound semiconductor is grown at a high temperature of about 1000° C. to thereby obtain preferred crystal. Accordingly, the crystallinity of the second group III nitride compound semiconductor layer formed on the buffer layer with good crystallinity is also improved.

The temperature of about 1000° C. is substantially equal to the growth temperature of the second group III nitride compound semiconductor layers (device function forming layers) formed on the first group III nitride compound semiconductor layer (buffer layer). Accordingly, the growth temperature at which the first group III nitride compound semiconductor is formed by the MOCVD method is selected to be preferably in a range of from 600 to 1200° C., more preferably in a range of from 800 to 1200° C.

When the growth temperature of the first group III nitride compound semiconductor layer (buffer layer) is equal to that of the second group III nitride compound semiconductor (device function forming layers) as described above, the temperature at which the MOCVD method is executed is adjusted easily.

Also when the buffer layer constituted by the first group III nitride compound semiconductor layer is formed on the metal nitride layer by a sputtering method, the buffer layer can be obtained as a buffer layer having preferable crystallinity equivalent to or higher than the crystallinity obtained in the case where the buffer layer is formed by the MOCVD method (growth temperature: 1000° C.). Accordingly, the crystallinity of the second group III nitride compound semiconductor layers formed on the first group III nitride compound semiconductor layer is also improved. Moreover, when the first group III nitride compound semiconductor layer (buffer layer) is formed by the sputtering method, expensive organic metals such as TMA, TMI, etc. are not required for raw materials compared with the MOCVD method. Hence, the device can be formed inexpensively. Embodiments of the present invention will be described below.

(First Embodiment)

This embodiment is a light-emitting diode 10, the configuration of which is shown in FIG. 1.

Specifications of respective layers are as follows.

| Layer | Component | Dopant |
|---|---|---|
| p-type layer 18 | p-GaN | Mg |
| Layer 17 including a light-emitting layer | including InGaN layer | |
| n-type layer 16 | n-GaN | Si |
| Buffer layer 15 | AlN | |
| TiN layer 14 | TiN | |
| Ti layer 13 | Ti | |
| Substrate 11 | sapphire | |

The n-type layer 16 may be of a double-layered structure with an n⁻ layer of a low electron density on the side of the layer 17 including the light-emitting layer and an n⁺ layer of a high electron density on the buffer layer 15 side. The later is called n-type contact layer.

The layer 17 including the light-emitting layer are not limited to the superlattice structure. A single or double hetero type structure, a homo-junction type structure, or the like, may be used as the configuration of the light-emitting device. A single quantum well structure may be also used.

A layer of $Al_XIn_YGa_{1-X-Y}N$ (including X=0, Y=0 and X=Y=0), which has a wide band gap and which is doped with an acceptor such as magnesium, or the like, may be interposed between the layer 17 including the light-emitting layer and the p-type layer 18. This technique is used for preventing electrons imparted into the layer 17 including the light-emitting layer from being diffused into the p-type layer 18.

The p-type layer 18 may be of a double-layered structure with a p⁻ layer of a low hole density on the side of the layer 17 including the light-emitting layer and a p⁺ layer of a high hole density on the electrode side. The latter is called p-type contact layer.

The Ti layer 13 is formed on a face a of the sapphire substrate by a reactive DC magnetron sputtering method. The target is exchanged and the TiN layer 14 is formed on the Ti layer 13 by a DC magnetron sputtering method. The target is further exchanged for Al and the AlN buffer layer 15 is formed by a DC magnetron sputtering method.

Then, the sample of AlN/TiN/Ti/sapphire is moved from the sputtering apparatus into a chamber of an MOCVD apparatus. While a hydrogen gas is circulated into this chamber, the sample is heated to 1100° C. and kept at 1100° C. for 5 minutes.

Then, the n-type layer 16 and group III nitride compound semiconductor layers after the n-type layer 16 are formed in accordance with an ordinary method (MOCVD method) while the temperature of 1100° C. is kept. In this growth method, an ammonia gas and gases of group III element alkyl compounds such as trimethylgallium (TMG), trimethylaluminum (TMA) and trimethylindium (TMI) are supplied onto a substrate heated to an appropriate temperature and are subjected to a heat decomposition reaction to thereby grow a desired crystal on the substrate.

The group III nitride compound semiconductor layers 16 to 18 formed thus have perferable crystallinity.

The light-transmissible electrode 19 is constituted by a thin film containing gold. The light-transmissible electrode 19 is laminated so as to cover the substantially whole upper surface of the p-type layer 18. The p-type electrode 20 is also formed out of a material containing gold. The p-type electrode 20 is formed on the light-transmissible electrode 19 by vapor deposition.

The n-type electrode 21 is formed by vapor deposition onto a surface of the n-GaN layer 16 exposed by etching.

Incidentally, the AlN buffer layer 15 may be formed by an MOCVD method or by any other method.

(Second Embodiment)

Figure 2:
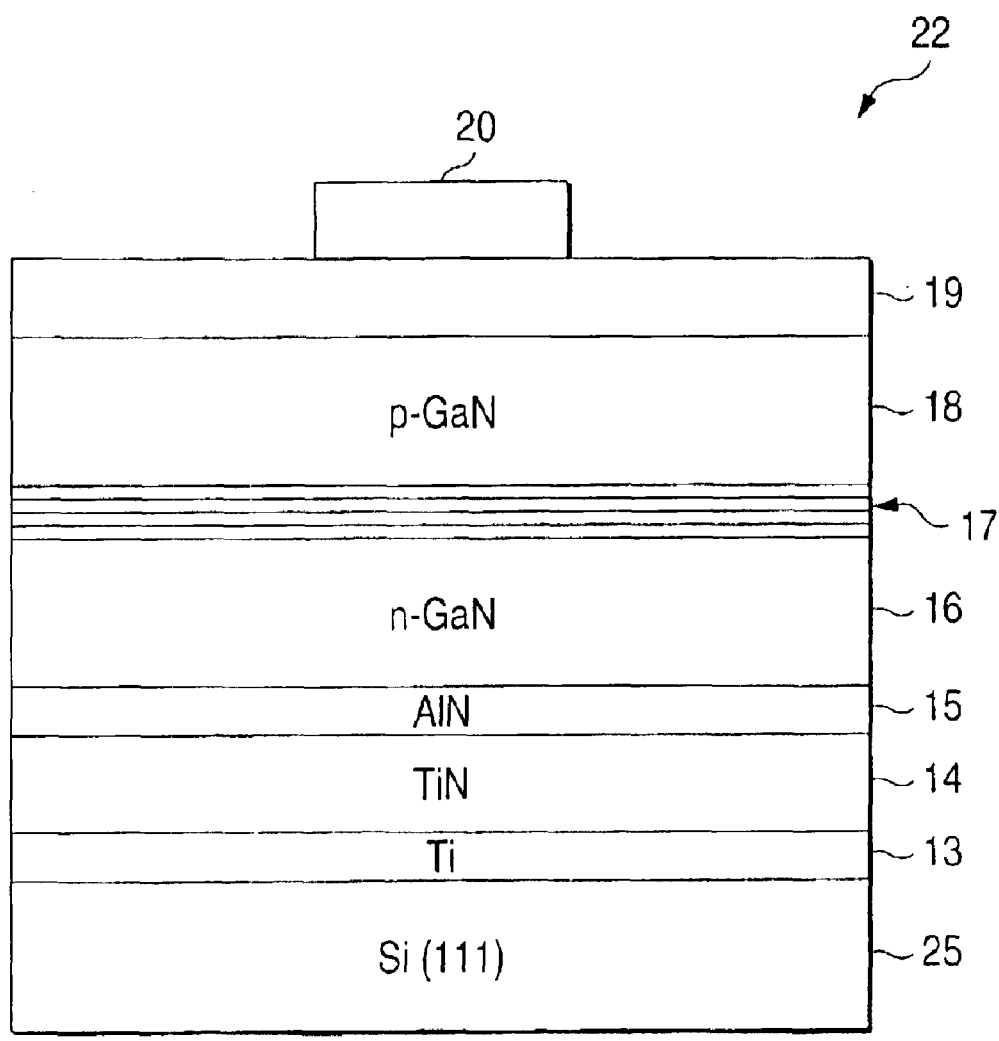
FIG. 2 is a view showing the configuration of a light-emitting diode according to a second embodiment of the present invention.

FIG. 2 shows a light-emitting diode 22 according to a second embodiment. Incidentally, parts the same as those in the first embodiment are referenced correspondingly and the description of the parts will be therefore omitted.

| Layer | Component | Dopant |
|---|---|---|
| p-type layer 18 | p-GaN | Mg |
| Layer 17 including a light-emitting layer | including InGaN layer | |
| n-type layer 16 | n-GaN | Si |
| Buffer layer 15 | AlN | |
| TiN layer 14 | TiN | |
| Ti layer 13 | Ti | |
| Substrate 25 | silicon single crystal (111) | |

The method of growing the TiN layer 14 and layers after the TiN layer 14 on the (111) surface of Si is the same as that in the first embodiment.

Incidentally, the Si substrate layer 25 can be used as an n-type electrode because it has electrically conductive characteristic. Incidentally, the AlN buffer layer 15 may be formed by an MOCVD method or by any other method. Further, an Al layer with a film thickness of 10 nm (100 Å) may be formed between the Si substrate and Ti.

(Third Embodiment)

Figure 3:
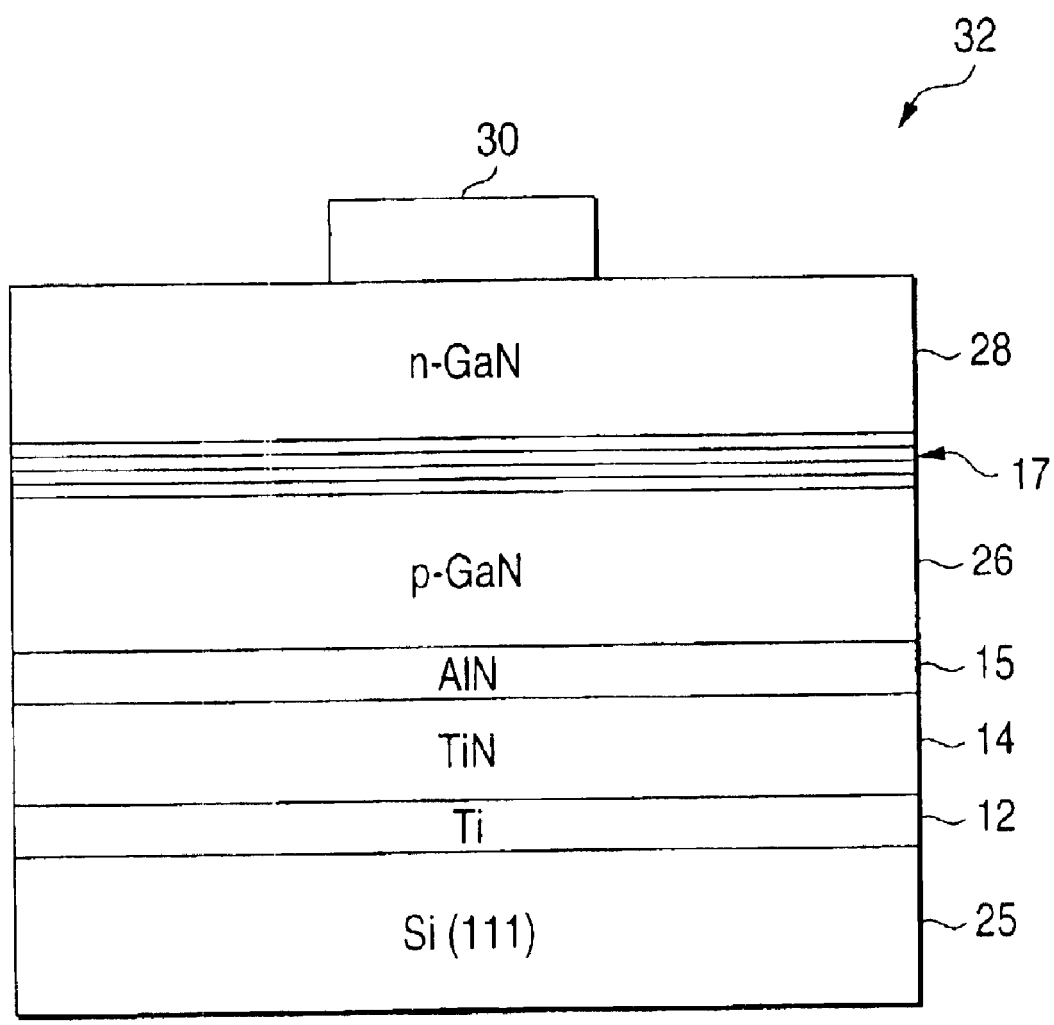
FIG. 3 is a view showing the configuration of a light-emitting diode according to a third embodiment of the present invention.

FIG. 3 shows a semiconductor device according to a third embodiment of the present invention. The semiconductor device in this embodiment is a light-emitting diode 32. Incidentally, parts the same as those in FIG. 2 are referenced correspondingly and the description of the parts will be therefore omitted.

Specifications of respective layers are as follows.

| Layer | Component | Dopant |
|---|---|---|
| n-type layer 28 | n-GaN | Si |
| Layer 17 including a light-emitting layer | including InGaN layer | |
| p-type layer 26 | p-GaN | Mg |
| Buffer layer 15 | AlN | |
| TiN layer 14 | TiN | |
| Ti layer 13 | Ti | |
| Substrate 25 | silicon single crystal (111) | |

As shown in FIG. 3, the p-type layer 26, the layer 17 including the light-emitting layer and the n-type layer 28 are grown successively on the buffer layer 15. Thus, a light-emitting diode 32 is formed. In the case of this device 32, the light-transmissible electrode (see the reference numeral in FIG. 2) can be omitted because the n-type layer 28 low in resistance value is provided as the uppermost layer.

In FIG. 3, the reference numeral 30 designates an n-type electrode. The Si substrate 25 can be directly used as a p-type electrode.

Incidentally, the AlN buffer layer 15 may be formed by an MOCVD method or by any other method. Further, an Al layer with a film thickness of 10 nm (100 Å) may be formed between the Si substrate and Ti.

(Fourth Embodiment)

FIGS. 4A and 4B show a further embodiment of the present invention. Incidentally, in FIGS. 4A and 4B, parts the same as those in the first embodiment are referenced correspondingly and the description of the parts will be therefore omitted. In this embodiment, the film thickness of the TiN layer 44 is set to be 50 μm and semiconductor layers 15 to 18 are formed on the TiN layer 44 by an MOCVD method (see FIG. 4A). Then, the Ti layer 13 is chemically etched with aqua regia, so that the substrate is separated from the TiN layer 44 (see FIG. 4B) Electrodes 19 to 21 are formed by vapor deposition in the same manner as in the first embodiment. Thus, a light-emitting diode 40 is obtained in this embodiment.

Although this embodiment has shown the case where the Ti layer 13 is removed by etching after the semiconductor layers 15 to 18 are formed, the present invention can be applied also to the case where the Ti layer 13 is removed after the semiconductor layers are partially formed.

The Ti layer 13 may be removed by etching just after the TiN layer 44 is formed. That is, a substrate of TiN is obtained.

The light-emitting diode 40 obtained in the aforementioned manner has TiN in bulk as a substrate. The TiN substrate 44 can be used as an electrode because TiN has electrically conductive characteristic. Moreover, light emitted from the light-emitting layer is efficiently reflected toward the emission observation surface side (upward in the drawings) because TiN has metallic gloss.

Although the aforementioned embodiment has shown the case where the buffer layer is formed by a DC magnetron sputtering method, the present invention may be applied also to the case where the buffer layer is formed by an MOCVD method or the like (in which, however, the growth temperature is a high temperature of 1000° C.).

INDUSTRIAL APPLICABILITY

The device to which the present invention is applied is not limited to the aforementioned light-emitting diode. For example, the present invention may be applied also to optical devices such as a light-receptor, a laser diode, a solar cell, etc.; bipolar devices such as a rectifier, a thyristor, a transistor, etc.; unipolar devices such as an FET, etc.; and electronic devices such as a microwave device, etc.

The present invention may be further applied to laminates which are intermediates of these devices.

The present invention is not limited to the description of the mode for carrying out the invention and the embodiments thereof at all, but includes various modifications that can be conceived by those skilled in the art, without departing from the scope of claim for a patent.

Items disclosed in this specification will be listed below.

First, there is disclosed a method of producing a laminate, including the steps of: forming a titanium layer on a substrate; forming a metal nitride layer on the titanium layer, the metal nitride layer being made of nitride of one kind of metal or of two or more kinds of metals selected from the group consisting of titanium, zirconium, hafnium and tantalum; and forming a group III nitride compound semiconductor layer on the metal nitride layer.

The above method may further include the step of forming an undercoat layer between the substrate and the titanium layer.

Further, the method may include the step of separating the substrate from the metal nitride layer by etching the titanium layer chemically. Here, preferably, the metal nitride layer has a film thickness of not smaller than 50 μm.

Further, in the method, the metal nitride layer may be made of titanium nitride. On the other hand, the substrate is made of sapphire, silicon carbide, gallium nitride, silicon, gallium phosphide or gallium arsenide.

Further, in the method, the group III nitride compound semiconductor device may be used as a light-emitting device or as a light-receptor.

Second, there is disclosed a laminate having: a titanium layer formed on a substrate; a metal nitride layer formed on the titanium layer and made of nitride of one kind of metal or of two or more kinds of metals selected from the group consisting of titanium, zirconium, hafnium and tantalum; and a group III nitride compound semiconductor layer formed on the metal nitride layer.

In the laminate, an undercoat layer maybe formed between the substrate and the titanium layer.

Further, the metal nitride layer maybe made of titanium nitride. On the other hand, the substrate may be made of sapphire, silicon carbide, gallium nitride, silicon, gallium phosphide or gallium arsenide.

Further, in the laminate, the group III nitride compound semiconductor layers may have a structure of a light-emitting device or a structure of a light-receptor.

Third, there is disclosed a laminate comprising: a metal nitride substrate having a film thickness of not smaller than 50 μm and made of nitride of one kind of metal or of two or more kinds of metals selected from the group consisting of titanium, zirconium, hafnium and tantalum; and a group III nitride compound semiconductor layer formed on the metal nitride substrate.

The metal nitride may be made of titanium nitride.

Further, the group III nitride compound semiconductor layers may have a structure of a light-emitting device or a structure of a light-receptor.

What is claimed is:

1. A method of producing a group III nitride compound semiconductor device, comprising:

forming a titanium layer on a substrate;

forming a metal nitride layer on said titanium layer, said metal nitride layer comprising a nitride of at least one metal selected from the group consisting of titanium, zirconium, hafnium, tantalum and an alloy including any of these metals;

forming a group III nitride compound semiconductor layer on said metal nitride layer; and separating said substrate from said metal nitride layer by etching said titanium layer.

2. A method of producing a group III nitride compound semiconductor device according to claim 1, further comprising:

forming an undercoat layer between said substrate and said titanium layer.

3. A method of producing a group III nitride compound semiconductor device according to claim 1, wherein said separating said substrate from said metal nitride layer comprises by etching said titanium layer chemically.

4. A method of producing a group III nitride compound semiconductor device according to claim 3, wherein said metal nitride layer has a film thickness of at least 50 μm.

5. A method of producing a group III nitride compound semiconductor device according to claim 1, wherein said metal nitride layer comprises titanium nitride.

6. A method of producing a group III nitride compound semiconductor device according to claim 1, wherein said substrate comprises one of sapphire, silicon carbide, gallium nitride, silicon, gallium phosphide and gallium arsenide.

7. A method of producing a group III nitride compound semiconductor device according to claim 1, wherein said group III nitride compound semiconductor device comprises one of a light-emitting device and a light-receptor.

8. A method of producing a group III nitride compound semiconductor device according to claim 1, wherein said forming said metal nitride layer comprises sputtering.

9. A method of producing a group III nitride compound semiconductor device according to claim 1, wherein said metal nitride layer has a thickness in a range from 5 nm to 10 $\mu$m.

10. A method of producing a group III nitride compound semiconductor device according to claim 1, wherein said titanium layer comprises a thickness in a range from 0.1 $\mu$m to 10 $\mu$m.

11. A group III nitride compound semiconductor device comprising:
    a substrate;
    a titanium layer formed directly on said substrate;
    a metal nitride layer formed on said titanium layer and comprising a nitride of at least one metal selected from the group consisting of titanium, zirconium, hafnium, tantalum and an alloy including any of these metals; and
    a group III nitride compound semiconductor layer formed on said metal nitride layer.

12. A group III nitride compound semiconductor device according to claim 11, further comprising:
    an undercoat layer formed between said substrate and said titanium layer, said titanium layer being formed directly on said undercoat layer.

13. A group III nitride compound semiconductor device according to claim 11, wherein said metal nitride layer comprises titanium nitride.

14. A group III nitride compound semiconductor device according to claim 13, wherein said substrate comprises sapphire.

15. A group III nitride compound semiconductor device according to claim 11, wherein said substrate comprises one of sapphire, silicon carbide, gallium nitride, silicon, gallium phosphide and gallium arsenide.

16. A group III nitride compound semiconductor device according to claim 11, wherein said group III nitride compound semiconductor device comprises one of a light-emitting device and a light-receptor.

17. A group III nitride compound semiconductor device comprising:
    a metal nitride substrate having a film thickness of at least 50 $\mu$m and comprising a nitride of at least one metal selected from the group consisting of titanium, zirconium, hafnium, tantalum and an alloy including any of these metals; and
    a group III nitride compound semiconductor layer formed on said metal nitride substrate.

18. A group III nitride compound semiconductor device according to claim 17, wherein said metal nitride comprises titanium nitride.

19. A group III nitride compound semiconductor device according to claim 17, wherein said group III nitride compound semiconductor device comprises one of a light-emitting device and a light-receptor.

20. A group III nitride compound semiconductor device according to claim 17, wherein said metal nitride substrate has a film thickness of at least 100 $\mu$m.

* * * * *